United States Patent
Choi et al.

(10) Patent No.: US 10,473,744 B2
(45) Date of Patent: Nov. 12, 2019

(54) MAGNETIC RESONANCE IMAGING APPARATUS AND METHOD OF OBTAINING MAGNETIC RESONANCE IMAGE THEREOF

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Sang-cheon Choi, Suwon-si (KR); Yun-ho Nam, Seoul (KR); Jong-ho Lee, Seoul (KR); Dae-ho Lee, Seongnam-si (KR); Yang-su Ryu, Seoul (KR); Han Jang, Seoul (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 312 days.

(21) Appl. No.: 15/094,408

(22) Filed: Apr. 8, 2016

(65) Prior Publication Data
US 2016/0299205 A1    Oct. 13, 2016

Related U.S. Application Data

(60) Provisional application No. 62/144,676, filed on Apr. 8, 2015.

(30) Foreign Application Priority Data

Dec. 11, 2015    (KR) .................. 10-2015-0177366

(51) Int. Cl.
*G01R 33/56*    (2006.01)
*G01R 33/483*    (2006.01)

(52) U.S. Cl.
CPC ..... *G01R 33/5607* (2013.01); *G01R 33/4835* (2013.01)

(58) Field of Classification Search
CPC .. G01R 33/56; G01R 33/561; G01R 33/5602; G01R 33/5607; G01R 33/5608;
(Continued)

(56) References Cited

U.S. PATENT DOCUMENTS 6,023,634 A * 2/2000 Hanawa ................. G01R 33/54
324/307
7,002,344 B2 2/2006 Griswold et al.
(Continued)

OTHER PUBLICATIONS

Takeo et al., "Fascinate: A Pulse Sequence for Simultaneous Acquisition of T2-Weighted and Fluid-Attenuated Images", Magnetic Resonance in Medicine 51:205-211, 2004, 7 total pages.
(Continued)

*Primary Examiner* — Son T Le
(74) *Attorney, Agent, or Firm* — Sughrue Mion, PLLC (57) ABSTRACT

A magnetic resonance imaging apparatus includes: a radio frequency (RF) controller configured to control a period of an RF pulse to be applied to an object for a time period that includes a first obtaining time, during which a first inversion RF pulse is applied, and a second obtaining time; and a signal transceiver configured to sequentially receive, during the first obtaining time, a first RF signal for generating a first fluid attenuated inversion recovery (FLAIR) image regarding a first slice of the object and a second RF signal for generating at least one magnetic resonance (MR) image regarding a second slice of the object.

17 Claims, 8 Drawing Sheets

(58) Field of Classification Search
CPC ............ G01R 33/4835; G01R 33/4608; G01R 33/4633; G01R 33/54
See application file for complete search history.

(56) References Cited

U.S. PATENT DOCUMENTS

2005/0030024 A1* 2/2005 Golay ................ G01R 33/4828
324/307
2010/0030062 A1* 2/2010 Bolar .................... A61B 5/055
600/419

OTHER PUBLICATIONS

Feinberg et al., "Multiplexed Echo Planar Imaging for Sub-Second Whole Brain FMRI and Fast Diffusion Imaging", PLoS One, vol. 5, Issue 12, Dec. 2010, 11 total pages.
Park et al., "Phase-Sensitive, Dual-Acquisition, Single-Slab, 3D, Turbo-Spin-Echo Pulse Sequence for Simultaneous T2-Weighted and Fluid-Attenuated Whole-Brain Imaging", Magnetic Resonance in Medicine 63:1422-1430, 2010, 9 total pages.

* cited by examiner

MAGNETIC RESONANCE IMAGING APPARATUS AND METHOD OF OBTAINING MAGNETIC RESONANCE IMAGE THEREOF

CROSS-REFERENCE TO RELATED APPLICATIONS

This application claims the benefit of U.S. Provisional Patent Application No. 62/144,676, filed on Apr. 8, 2015, in the U.S. Patent and Trademark Office, and priority from Korean Patent Application No. 10-2015-0177366, filed on Dec. 11, 2015, in the Korean Intellectual Property Office, the disclosures of which are incorporated herein by reference in their respective entireties.

BACKGROUND

1. Field

Exemplary embodiments relate to magnetic resonance imaging apparatuses and methods for obtaining magnetic resonance images thereof, and more particularly, to methods and apparatuses for obtaining multi-contrast magnetic resonance images.

2. Description of the Related Art

Magnetic resonance imaging (MRI) is used to capture and display an image by using information that is obtained through resonance after atomic nuclei are exposed to a magnetic field. The resonance of atomic nuclei refers to a phenomenon by which, when a particular radio frequency is incident on the atomic nuclei which are magnetized by an external magnetic field, the atomic nuclei in a low energy state are excited to a high energy state by absorbing radio frequency energy. The atomic nuclei have different resonance frequencies from each other according to types of the atomic nuclei, and the resonance is influenced by the magnitude of the external magnetic field. There are numerous atomic nuclei in the human body, and in general, hydrogen atomic nuclei are used in MRI.

In regard to obtaining a magnetic resonance image, there has been an increasing demand for technologies that relate to processing magnetic resonance images rapidly.

In order to efficiently obtain three-dimensional (3D) volume information that relates to an object, a method in which several pieces of two-dimensional (2D) slice images are obtained in a direction of slices that constitute the 3D volume is used. In this case, it is typical to capture as many 2D slice images as the number of the slices.

A multi-slice imaging technique is being developed to reduce a time necessary for restoring a magnetic resonance image. The multi-slice imaging technique is a technique for obtaining magnetic resonance (MR) signals that respectively correspond to a plurality of slices with respect to an object within one repetition time (TR) and separating and rearranging the signals into images that respectively correspond to positions of the signals.

Accordingly, there is a need for a method and apparatus for rapidly obtaining, during one TR, magnetic resonance images of a type that is useful in the multi-slice imaging technique.

SUMMARY

Provided are magnetic resonance imaging apparatuses for obtaining multi-contrast magnetic resonance images, and methods for obtaining magnetic resonance images.

Additional aspects will be set forth in part in the description which follows and, in part, will be apparent from the description, or may be learned by practice of the presented exemplary embodiments.

According to an aspect of an exemplary embodiment, a magnetic resonance imaging (MRI) apparatus includes: a radio frequency (RF) controller configured to control a period of an RF pulse to be applied to an object for a time period which includes a first obtaining time, during which a first inversion RF pulse is applied, and a second obtaining time; and a signal transceiver configured to sequentially receive, during the first obtaining time, a first RF signal for generating a first fluid attenuated inversion recovery (FLAIR) image that relates to a first slice of the object and a second RF signal for generating at least one magnetic resonance (MR) image that relates to a second slice of the object.

The MRI apparatus may further include an image processor configured to obtain the first FLAIR image based on the first RF signal and to obtain the at least one MR image based on the second RF signal.

After an inversion time (TI) ends, the first RF signal for generating the first FLAIR image may be received earlier than the second RF signal for generating the at least one first MR image.

The first obtaining time may be included in one half of a repetition time (TR), and the second obtaining time may be included in the other half of the TR.

The image processor may be further configured to obtain, based on the second RF signal, at least one image from among a T1 weighted image, a T2 weighted image, a T2* weighted image, and a proton density (PD) image.

The image processor may be further configured to sequentially obtain the at least one image.

The RF controller may be further configured to apply a second inversion RF pulse during the second obtaining time, and the signal transceiver may be further configured to sequentially receive, during the second obtaining time, a third RF signal for generating a second FLAIR image that relates to the second slice and a fourth RF signal for generating at least one MR image that relates to the first slice.

The MRI apparatus may further include an image processor configured to obtain the second FLAIR image based on the third RF signal and to obtain the at least one second MR image based on the fourth RF signal.

According to an aspect of another exemplary embodiment, a method for obtaining a magnetic resonance (MR) image includes: applying a first inversion radio frequency (RF) pulse to an object during a first obtaining time; applying an RF pulse to the object for a time period that includes the first obtaining time and a second obtaining time; and sequentially receiving a first RF signal for generating a first fluid attenuated inversion recovery (FLAIR) image that relates to a first slice of the object and a second RF signal for generating at least one MR image that relates to a second slice of the object.

The method may further include obtaining the first FLAIR image based on the first RF signal and obtaining the at least one MR image based on the second RF signal.

After an inversion time (TI) ends, the first RF signal for generating the first FLAIR image may be received earlier than the second RF signal for generating the at least one MR image.

The first obtaining time may be included in one half of a repetition time (TR), and the second obtaining time may be included in the other half of the TR.

The obtaining the at least one MR image may include obtaining at least one image from among a T1 weighted image, a T2 weighted image, a T2* weighted image, and a proton density (PD) image.

The obtaining the at least one image may include sequentially obtaining the at least one image.

The method may further include applying a second inversion RF pulse during the second obtaining time, and receiving, during the second obtaining time, a third RF signal for generating a second FLAIR image that relates to the second slice and a fourth RF signal for generating at least one MR image that relates to the first slice.

The method may further include obtaining the second FLAIR image based on the third RF signal and obtaining the at least one MR image that relates to the first slice based on the fourth RF signal.

According to an aspect of another exemplary embodiment, there is provided a non-transitory computer-readable recording medium having recorded thereon a program for implementing the method for obtaining a magnetic resonance image.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

The disclosed advantages and features and the methodology for accomplishing the same may be understood more readily by reference to the following description of exemplary embodiments and the accompanying drawings. The present inventive concept may, however, be embodied in many different forms and should not be construed as being limited to the exemplary embodiments set forth herein; rather, the present exemplary embodiments are provided so that this disclosure will be thorough and complete and will fully convey the present inventive concept to one of ordinary skill in the art, and one or more exemplary embodiments are defined by the scope of claims.

Terms used herein will be briefly described, and then, one or more exemplary embodiments will be described in detail.

The terms used herein are selected from general terms currently widely used while considering functions in one or more exemplary embodiments. However, the terms used herein may differ according to the intention of one of ordinary skill in the art, the precedent, or the advent of new technology. Further, some terms are arbitrarily selected by the present applicant, and in this case, the meaning of those terms will be described in detail herein. Therefore, the terms used herein shall be defined based on the meaning of the terms and content throughout the present specification, rather than simple designations of the terms.

Throughout the present application, when a part "includes" an element, it is to be understood that the part additionally includes other elements rather than excluding other elements as long as there is no particular opposing disclosure. Further, the term, such as "unit", "-or", "-er", or the like, used herein refers to a software component, or a hardware component such as a field-programmable gate array (FPGA) or application-specific integrated circuit (ASIC), and the "unit", "-or", "-er", or the like performs a certain function. However, the "unit", "-or", "-er", or the like is not limited to software or hardware. The "unit", "-or", "-er", or the like may be configured in an addressable storage medium and may be configured to be executed by one or more processors. Hence, the "unit", "-or", "-er", or the like includes, for example, any one or more of elements such as software elements, object-oriented software elements, class elements, and task elements, and processes, functions, attributes, procedures, sub-routines, segments of program codes, drivers, firmware, micro-codes, circuits, data, databases, data structures, tables, arrays, and variables. The functions provided in the elements and the "units", "-ors", "-ers", or the like may be combined into a fewer number of elements and "units", "-ors", "-ers", or the like or may be divided into a larger number of elements and "units", "-ors", "-ers", or the like.

Reference will now be made in detail to one or more exemplary embodiments, examples of which are illustrated in the accompanying drawings, so that one of ordinary skill in the art may implement the one or more exemplary embodiments easily. Further, description of parts in the drawings that are not related to one or more exemplary embodiments are omitted to clearly describe the one or more exemplary embodiments. As used herein, the term "and/or" includes any and all combinations of one or more of the associated listed items. Expressions such as "at least one of," when preceding a list of elements, modify the entire list of elements and do not modify the individual elements of the list.

The term "image" used herein may refer to multi-dimensional data composed of discrete image elements (e.g., pixels in a two-dimensional image and voxels in a three-dimensional image). For example, an image may include a medical image that relates to an object, obtained by any of an X-ray apparatus, a computed tomography (CT) apparatus, a magnetic resonance imaging (MRI) apparatus, an ultrasonic diagnosis apparatus, or other medical imaging apparatuses.

In the present specification, an "object" may include a person or an animal, or a part of a person or an animal. For example, an object may include an organ, such as liver, heart, womb, brain, breast, or abdomen, or a blood vessel. Furthermore, the "object" may include a phantom. The phantom refers to a material having a volume that is approximately equivalent to the intensity and effective atomic number of a living thing and may include a sphere phantom that has properties which are similar to a human body.

The term "user" used herein may refer to any of a medical professional, such as a doctor, a nurse, a medical laboratory technologist, or a medical imaging professional, or an engineer who repairs a medical apparatus, but a user is not limited thereto.

The term "magnetic resonance (MR) image" refers to an image that relates to an object obtained by using the nuclear magnetic resonance principle.

The term "pulse sequence" used herein refers to continuity of signals repeatedly applied in an MRI system. A pulse sequence may include a time parameter of a radio frequency (RF) pulse, for example, repetition time (TR), time to echo (TE), or the like.

In the present specification, a "pulse sequence mimetic diagram" shows an order of events that occur in an MRI system. For example, a pulse sequence mimetic diagram may be a diagram that shows an RF pulse, a gradient magnetic field, an MR signal, or the like as a function of time.

An MRI system is an apparatus for obtaining a sectional image that relates to a part of an object by expressing, in a contrast comparison, an intensity of an MR signal with respect to an RF signal generated in a magnetic field having a specific magnitude. For example, if an RF signal that resonates only a specific atomic nucleus (for example, a hydrogen atomic nucleus) is irradiated for an instant onto an object placed in a strong magnetic field and then such irradiation stops, an MR signal is emitted from the specific atomic nucleus, and the MRI system may receive the MR signal and obtain an MR image. The MR signal denotes an RF signal emitted from the object. The intensity of the MR signal may be determined based on any one or more of a density of a predetermined atom (for example, hydrogen) included in the object, relaxation time T1, relaxation time T2, and blood flow.

The MRI system has characteristics that are different from other imaging apparatuses. Unlike imaging apparatuses such as CT apparatuses that obtain images that vary based upon a direction of detecting hardware, the MRI system may obtain two-dimensional (2D) images or three-dimensional (3D) volume images that are oriented toward a selected point. Further, unlike CT apparatuses, X-ray apparatuses, position emission tomography (PET) apparatuses, and single photon emission CT (SPECT) apparatuses, the MRI system does not expose objects and examiners to radiation, and as the MRI system may obtain images that have a relatively high soft tissue contrast, the MRI system may obtain neurological images, intravascular images, musculoskeletal images, and oncologic images, in which precision in the description of abnormal tissue is important.

Figure 1:
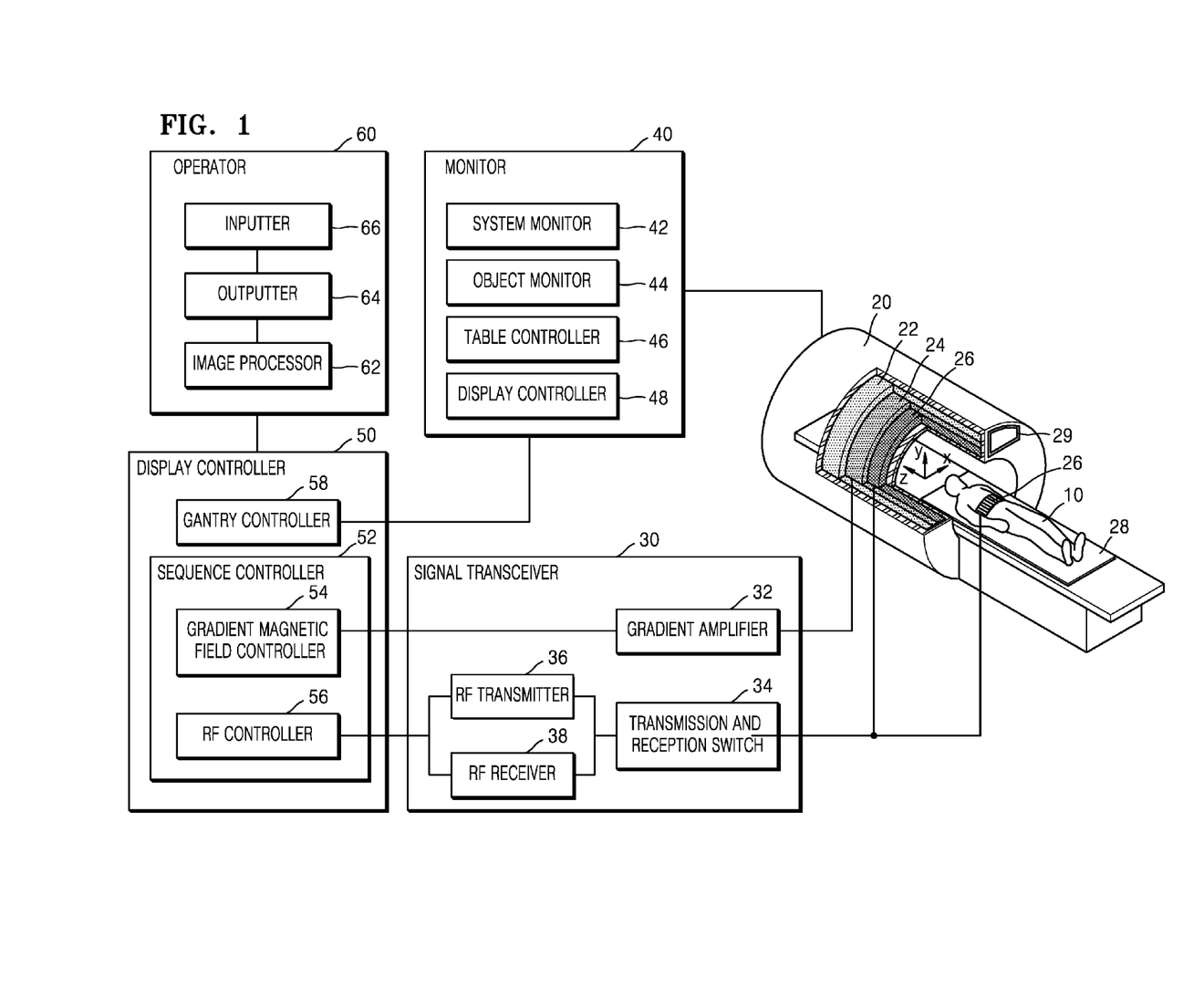
FIG. 1 is a block diagram of a general magnetic resonance imaging (MRI) system.

FIG. 1 is a block diagram of a general MRI system. Referring to FIG. 1, the general MRI system may include a gantry 20, a signal transceiver 30, a monitor 40, a system controller 50, and an operator 60.

The gantry 20 blocks electromagnetic waves generated by a main magnet 22, a gradient coil 24, and an RF coil 26 from being externally emitted. A magnetostatic field and a gradient magnetic field are formed in a bore in the gantry 20, and an RF signal is irradiated towards an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that may be inserted into a cylinder within the bore, along a horizontal axis of the cylinder.

The main magnet 22 is configured to generate a magnetostatic field or a static magnetic field for arranging magnetic dipole moments of atomic nuclei included in the object 10 in a constant direction. When a magnetic field generated by the main magnet 22 is strong and uniform, a relatively precise and accurate MR image of the object 10 may be obtained.

The gradient coil 24 includes X, Y, and Z coils configured for generating gradient magnetic fields in X-axis, Y-axis, and Z-axis directions which intersect each other at right angles. The gradient coil 24 may provide position information that relates to each region of the object 10 by variably inducing resonance frequencies according to the regions of the object 10.

The RF coil 26 is configured to irradiate an RF signal toward a patient and receive an MR signal emitted from the patient. In detail, the RF coil 26 may transmit an RF signal at the same frequency as precessional motion towards atomic nuclei in the patient that are in precessional motion, stop transmitting the RF signal, and then receive an MR signal emitted from the atomic nuclei in the patient.

For example, in order to cause an atomic nucleus to transit from a low energy state to a high energy state, the RF coil 26 may generate an electromagnetic wave signal that has an RF which corresponds to a type of the atomic nucleus, for example, an RF signal, and apply the electromagnetic wave signal to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus, to which the electromagnetic waves were applied, transits from the high energy state to the low energy state and thus may emit electromagnetic waves that have a Larmor frequency. In this aspect, when the electromagnetic wave signal is no longer applied to the atomic nucleus, an energy level of the atomic nucleus to which the electromagnetic waves were applied is changed from a high energy level to a low energy level, and thus, the atomic nucleus may emit electromagnetic waves that have a Larmor frequency. The RF coil 26 may receive electromagnetic wave signals emitted from atomic nuclei in the object 10.

The RF coil 26 may be realized as one RF transmitting and receiving coil that implements both of a function of generating electromagnetic waves having an RF which corresponds to a type of an atomic nucleus and a function of receiving electromagnetic waves emitted from an atomic nucleus. Alternatively, the RF coil 26 may be realized as a transmitting RF coil that implements a function of generating electromagnetic waves having an RF which corresponds to a type of an atomic nucleus, and a receiving RF coil that implements a function of receiving electromagnetic waves emitted from an atomic nucleus.

The RF coil 26 may be detachably fixed to the gantry 20. When the RF coil 26 is detachable, the RF coil 26 may be an RF coil that is configured for a specific part of the object 10, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may include any of a birdcage coil, a surface coil, or a transverse electromagnetic (TEM) coil according to structures of a coil.

The RF coil 26 may include any of a transmission exclusive coil, a reception exclusive coil, or a transmission and reception coil according to methods of transmitting and receiving an RF signal.

The RF coil 26 may include an RF coil that implements any one of various numbers of channels, such as 16 channels, 32 channels, 72 channels, and 144 channels.

The gantry 20 may further include an external display 29 which is positioned outside the gantry 20 and an internal display (not shown) which is positioned inside the gantry 20. The gantry 20 may provide predetermined information to the user or the object 10 via the external display 29 and/or via the internal display.

The signal transceiver 30 may be configured to control the gradient magnetic field formed inside the gantry 20, i.e., in the bore, based on a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 may be configured to drive the gradient coil 24 included in the gantry 20 and may supply a pulse signal for generating a gradient magnetic field to the gradient coil 24 under control of a gradient magnetic field controller 54. By controlling the pulse signal supplied from the gradient amplifier 32 to the gradient coil 24, gradient magnetic fields in the X-axis, Y-axis, and Z-axis directions may be composed.

The RF transmitter 36 and the RF receiver 38 may be configured to drive the RF coil 26. The RF transmitter 36 may supply an RF pulse at a Larmor frequency to the RF coil 26, and the RF receiver 38 may receive an MR signal received by the RF coil 26.

The transmission and reception switch 34 may be configured to adjust transmitting and receiving directions of the RF signal and the MR signal. For example, the RF signal may be irradiated toward the object 10 via the RF coil 26 during a transmission mode, and the MR signal may be received from the object 10 via the RF coil 26 during a reception mode. The transmission and reception switch 34 may be controlled by a control signal received from an RF controller 56.

The monitor 40 may be configured to monitor or control the gantry 20 or devices mounted in the gantry 20. The monitor 40 may include a system monitor 42, an object monitor 44, a table controller 46, and a display controller 48.

The system monitor 42 may be configured to monitor and control any or all of a state of a magnetostatic field, a state of a gradient magnetic field, a state of an RF signal, a state of an RF coil, a state of a table, a state of a device measuring body information regarding an object, a power supply state, a state of a thermal exchanger, a state of a compressor, and the like.

The object monitor 44 is configured to monitor a state of the object 10. In detail, the object monitor 44 may include any of a camera configured for observing a movement or a position of the object 10, a respiration measurer configured for measuring respiration of the object 10, an electrocardiogram (ECG) measurer configured for measuring ECG of the object 10, and/or a temperature measurer configured for measuring a temperature of the object 10.

The table controller 46 is configured to control a movement of the table 28 upon which the object 10 is positioned. The table controller 46 may control the movement of the table 28 based on sequence control of a sequence controller 52. For example, during motion-related imaging with respect to the object 10, the table controller 46 may cause the table 28 to continuously or discontinuously move based on the sequence control of the sequence controller 52, and thus, an image of the object 10 may be photographed in a larger field of view (FOV) than that of the gantry 20.

The display controller 48 is configured to control the external display 29 and the internal display disposed respectively outside and inside the gantry 20. In detail, the display controller 48 may control a power-on and a power-off state of any of the external display 29 and the internal display, a screen to be output on the external display 29 and the internal display, and/or the like. Further, when a speaker is located inside or outside the gantry 20, the display controller 48 may control a power-on and a power-off state of the speaker, sound to be output through the speaker, and/or the like.

The system controller 50 may include the sequence controller 52, which is configured for controlling a sequence of signals formed in the gantry 20, and a gantry controller 58, which is configured for controlling the gantry 20 and devices mounted in the gantry 20.

The sequence controller 52 may include the gradient magnetic field controller 54, which is configured for controlling the gradient amplifier 32, and the RF controller 56, which is configured for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 based on a pulse sequence received from the operator 60. In this regard, the pulse sequence includes all information required to control the gradient amplifier 32, the RF transmitter 36, the RF receiver 38, and the transmission and reception switch 34, and for example, may include information that relates to an intensity, an application time, and an application timing of a pulse signal that is to be applied to the gradient coil 24.

The operator 60 may be configured to request the system controller 50 for pulse sequence information while controlling an overall operation of the MRI system.

The operator 60 may include an image processor 62 which is configured for receiving a transmission of an MR signal received by the RF receiver 38 and processing the MR signal, an outputter 64, and an inputter 66.

The image processor 62 may be further configured to process an MR signal received via the RF receiver 38 and to generate MR image data that relates to the object 10.

The image processor 62 receives a transmission of an MR signal received by the RF receiver 38 and performs any one of various signal processes, such as amplification, frequency transformation, phase detection, low frequency amplification, and filtering, on the received MR signal.

For example, the image processor 62 may arrange digital data in a k-space (for example, also referred to as a Fourier space or frequency space) of a memory and rearrange the digital data as image data via 2D or 3D Fourier transformation.

If required, the image processor 62 may perform any one or more of a composition process, a difference calculation process, or the like on the image data. The composition process may include any of an addition process, a maximum intensity projection (MIP) process, or the like with respect to a pixel. The image processor 62 may store not only rearranged image data, but also image data on which a composition process or difference calculation process is performed, in a memory (not shown) or in an external server.

Various signal processes applied to MR signals by the image processor 62 may be performed in parallel. For example, a signal process may be performed on a plurality of MR signals received by a multi-channel RF coil in parallel, in order to rearrange the plurality of MR signals as image data.

The outputter 64 may be configured to output image data generated or rearranged by the image processor 62 to the user. Further, the outputter 64 may output information that is required in order for the user to manipulate the MRI system, such as a user interface (UI), user information, and/or object information. The outputter 64 may include any of a speaker, a printer, a cathode ray tube (CRT) display, a liquid crystal display (LCD), a plasma display panel (PDP), an organic light-emitting diode (OLED) display, a field emission display (FED), a light-emitting diode (LED) display, a vacuum fluorescent display (VFD), a digital light processing (DLP) display, a flat panel display (FPD), a 3D display, and/or a transparent display, or may include any one of other various output devices that are well known to one of ordinary skill in the art.

The user may input object information, parameter information, scan conditions, a pulse sequence, information that relates to image composition or difference calculation, and/ or the like by using the inputter (also referred to herein as an "input unit") 66. The input unit 66 may include any of a keyboard, a mouse, a track ball, a voice recognizer, a gesture recognizer, and/or a touchscreen, or may include any one of other various input devices that are well known to one of ordinary skill in the art.

Although the signal transceiver 30, the monitor 40, the system controller 50, and the operator 60 are separate from each other in FIG. 1, it will be sufficiently understood by one of ordinary skill in the art that respective functions of the signal transceiver 30, the monitor 40, the system controller 50, and the operator 60 may be performed by another element. For example, although it has been described above that the image processor 62 converts an MR signal received by the RF receiver 38 into a digital signal, such conversion to a digital signal may be directly performed by the RF receiver 38 or the RF coil 26.

The gantry 20, the RF coil 26, the signal transceiver 30, the monitor 40, the system controller 50, and the operator 60 may be connected to each other via wires or wirelessly, and when they are connected to each other wirelessly, the MRI system may further include an apparatus (not shown) for synchronizing clocks between each other. Communication between the gantry 20, the RF coil 26, the signal transceiver 30, the monitor 40, the system controller 50, and the operator 60 may be performed using a high-speed digital interface, such as, for example, any of low voltage differential signaling (LVDS), asynchronous serial communication such as universal asynchronous receiver transmitter (UART), a low-delay network protocol such as error synchronous serial communication or controller area network (CAN), or optical communication, or any other communication method that is well known to one of ordinary skill in the art.

Figure 2:
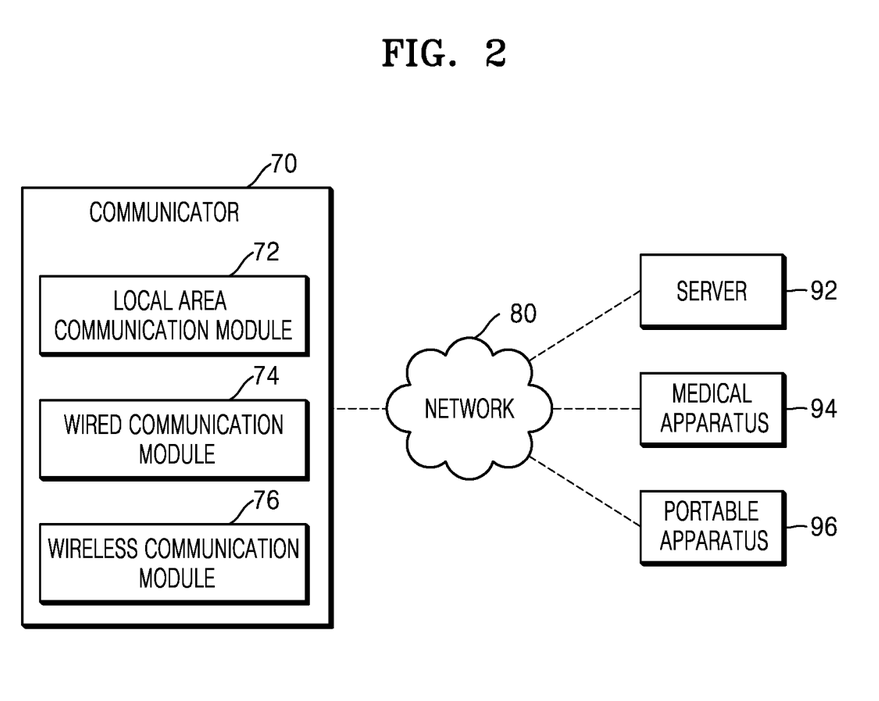
FIG. 2 is a block diagram of a communicator, according to an exemplary embodiment.

FIG. 2 is a block diagram of a communicator 70, according to an exemplary embodiment. The communicator 70 may be connected to at least one of the gantry 20, the signal transceiver 30, the monitor 40, the system controller 50, and the operator 60 of FIG. 1.

The communicator 70 may transmit or receive data to or from a hospital server or another medical apparatus in a hospital via a connection to a picture archiving and communication system (PACS), and may perform data communication according to the digital imaging and communications in medicine (DICOM) standard.

As shown in FIG. 2, the communicator 70 may be connected to a network 80 via wires or wirelessly in order to communicate with a server 92, a medical apparatus 94, and/or a portable apparatus 96.

In detail, the communicator 70 may transmit or receive data related to diagnosis of an object via the network 80, and may also transmit or receive a medical image captured by the medical apparatus 94, such as a CT apparatus, an MRI apparatus, or an X-ray apparatus. Further, the communicator 70 may receive a diagnosis history, a treatment schedule, or the like of the object from the server 92 in order to facilitate performance of a diagnosis with respect to the object. Further, the communicator 70 may perform data communication not only with the server 92 or medical apparatus 94 in a hospital but also with any of the portable apparatus 96, such as a cell phone, a personal digital assistant (PDA), and/or a laptop of a doctor or client.

In addition, the communicator 70 may transmit information that relates to a malfunction of the MRI system and/or information that relates to medical image quality to the user via the network 80, and may receive feedback from the user.

The communicator 70 may include at least one element that facilitates communication with an external apparatus, for example, a local area communication module 72, a wired communication module 74, and a wireless communication module 76.

The local area communication module 72 is a module which is configured for performing local area communication with a device within a predetermined distance. Examples of local area communication technology, according to an exemplary embodiment, include a wireless local area network (LAN), Wi-Fi, Bluetooth, ZigBee, Wi-Fi direct (WFD), ultra wideband (UWB), infrared data association (IrDA), Bluetooth low energy (BLE), and near field communication (NFC), but are not limited thereto.

The wired communication module 74 is a module which is configured for performing communication by using an electric signal or optical signal. Examples of wired communication technology, according to an exemplary embodiment, include wired communication technologies using a pair cable, a coaxial cable, and an optical fiber cable, and other wired communication technologies that are well known to one of ordinary skill in the art.

The wireless communication module 76 is configured to transmit and/or receive a wireless signal to or from at least one of a base station, an external apparatus, and a server in a mobile communication network. In this regard, the wireless signal may include data in any one of various formats according to transmitting and receiving a voice call signal, a video call signal, and a text/multimedia message.

Figure 3A:
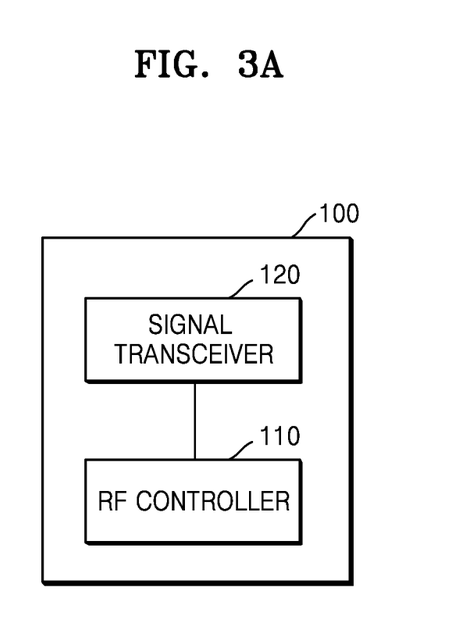
FIG. 3A is a block diagram of an MRI apparatus, according to an exemplary embodiment.

FIG. 3A is a schematic block diagram of an MR image processing apparatus 100, according to an exemplary embodiment. The MRI apparatus 100 includes an RF controller 110 and a signal transceiver 120.

The RF controller 110 is configured to control a period of an RF pulse to be applied to an object for a time period that includes a first obtaining time during which a first inversion RF pulse is applied and a second obtaining time. In this regard, the period of the RF pulse may correspond to an RF pulse that is applied during one TR.

The signal transceiver 120 is configured to sequentially receive a first RF signal and a second RF signal during the first obtaining time. The first RF signal is a signal for generating a fluid attenuated inversion recovery (FLAIR) image that relates to a first slice of the object. The second RF signal is a signal for generating at least one MR image that relates to a second slice of the object. In this regard, the first slice and the second slice may be slices that are adjacent to each other. For example, the first slice and the second slice may be consecutively adjacent slices. Alternatively, the first slice and the second slice may be consecutive slices that are interleaved with at least one slice therebetween. Hereinafter, the FLAIR image that relates to the first slice that is imaged using the first RF signal will be referred to as a first FLAIR image.

Figure 3B:
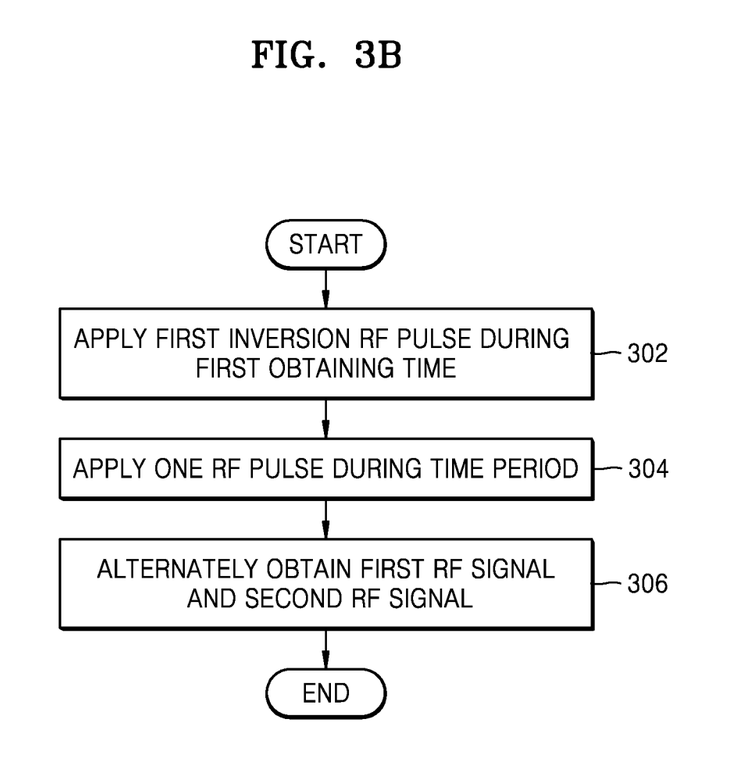
FIG. 3B is a flowchart of a method for obtaining a magnetic resonance image, according to an exemplary embodiment.

FIG. 3B is a schematic flowchart of a method for obtaining an MR image, according to an exemplary embodiment. In operation 302, the MRI apparatus 100 applies a first inversion RF pulse to an object during a first obtaining time.

In operation 304, the MRI apparatus 100 applies an RF pulse to the object for a time period that includes the first obtaining time and a second obtaining time.

In operation 306, the MRI apparatus 100 sequentially receives a first RF signal and a second RF signal. The first RF signal is a signal for generating a first FLAIR image that relates to a first slice of the object. The second RF signal is a signal for generating at least one MR image that relates to a second slice of the object.

Figure 4:
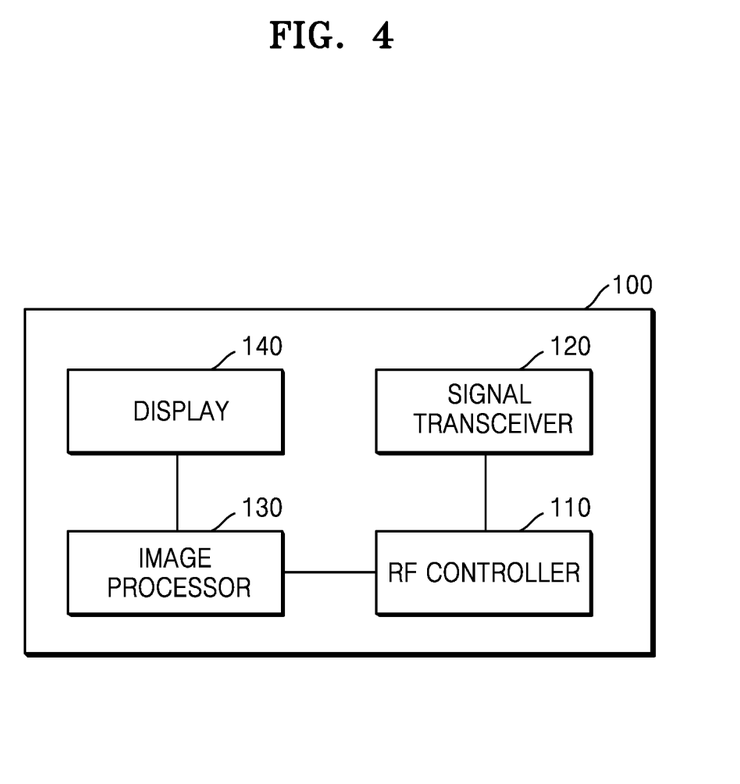
FIG. 4 is a block diagram of an MRI apparatus, according to an exemplary embodiment.

FIG. 4 is a block diagram of the MRI apparatus 100, according to an exemplary embodiment. The MRI apparatus 100 may include the RF controller 110, the signal transceiver 120, an image processor 130, and a display 140.

The RF controller 110 may control a period of an RF pulse to be applied to an object for a time period that includes a first obtaining time during which a first inversion RF pulse is applied and a second obtaining time. In the present exemplary embodiment, the MRI apparatus 100 may obtain an MR image that has multi-contrast by applying the RF pulse to the object.

The application of the RF pulse may include an application of a plurality of RF pulses that may obtain, from slices of the object that are different from each other, signals for generating MR images that have different contrast from each other. For example, the application of the RF pulse may include a plurality of RF pulses that have different frequencies from each other in order to obtain MR signals corresponding to a plurality of slices different from each other, and are consecutively applied. In the present exemplary embodiment, the application of the RF pulse may include an application of an inversion RF pulse for generating a FLAIR image.

In the present exemplary embodiment, the first obtaining time may be included in one half (i.e., a first half) of the TR. Further, the second obtaining time may be included in the other half (i.e., a second half) of the TR. The MRI apparatus 100 may apply a second inversion RF pulse during the second obtaining time.

The signal transceiver 120 may sequentially receive a first RF signal of the object and a second RF signal of the object during the first obtaining time. The first RF signal may be a signal for generating a first FLAIR image that relates to a first slice of the object. The second RF signal may be a signal for generating at least one first MR image that relates to a second slice of the object.

In the present exemplary embodiment, the at least one first MR image may include at least one of a T1 weighted image, a T2 weighted image, a T2* weighted image, and a proton density (PD) image (noting that "T1" refers to a longitudinal relaxation time of tissue, "T2" refers to a transverse relaxation time of tissue, and T2* refers to a transverse relaxation time for which the rate of decay of the transverse magnetization is faster). For example, the MRI apparatus 100 may obtain a FLAIR image, a T2 weighted image, and a T2* weighted image of the object together by using an RF signal received in response to an RF pulse applied during the first obtaining time.

For example, in the present exemplary embodiment, an inversion RF pulse for obtaining a FLAIR image that relates to the first slice may be applied within a first time interval that corresponds to a half of one period of an RF pulse that is applied during one TR, and sufficient MR signals for obtaining an MR image that relates to the second slice may be obtained during an inversion time (TI) according to the inversion RF pulse. After the TI ends, the MRI apparatus 100 may obtain sufficient MR signals for obtaining the FLAIR image that relates to the first slice. Furthermore, sufficient MR signals for obtaining at least one of a T1 weighted image, a T2 weighted image, a T2* weighted image, and a PD image that relate to the second slice may be obtained subsequently. An MR signal for obtaining an image that relates to the second slice may be referred to as the second RF signal.

The image processor 130 may obtain the first FLAIR image that relates to the first slice based on the first RF signal. Further, the image processor 130 may obtain at least one first MR image that relates to the second slice based on the second RF signal.

The signal transceiver 120 may sequentially receive a third RF signal and a fourth RF signal of the object during the second obtaining time. The third RF signal may be a signal for generating a FLAIR image that relates to the second slice of the object. The fourth RF signal may be a signal for generating at least one second MR image that relates to the first slice of the object. Hereinafter, the FLAIR image that relates to the second slice that is imaged using the third RF signal will be referred to as a second FLAIR image.

In the present exemplary embodiment, the image processor 130 may obtain the second FLAIR image that relates to the second slice based on the third RF signal. Further, the image processor 130 may obtain at least one second MR image that relates to the first slice based on the fourth RF signal.

In the present exemplary embodiment, the at least one second MR image may include at least one of a T1 weighted image, a T2 weighted image, a T2* weighted image, and a PD image. For example, the MRI apparatus 100 may obtain a FLAIR image, a T2 weighted image, and a T2* weighted image that relate to the object together by using an RF signal received in response to an RF pulse applied during the second obtaining time.

The display 140 may display an image obtained by the image processor 130. The image obtained by the image processor 130 may have multi-contrast. The display 140 may display each image that has multi-contrast.

Figure 5:
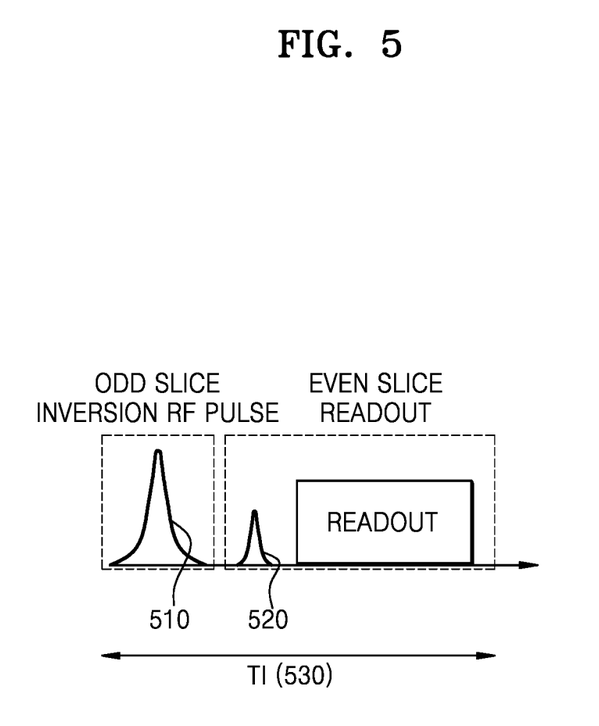
FIG. 5 illustrates a part of a sequence, according to an exemplary embodiment.

FIG. 5 illustrates a part of a sequence, according to an exemplary embodiment. In order to obtain a FLAIR image, an inversion RF pulse has to be applied to an object. In this case, a TI 530 that includes a delay time according to the applying of the inversion RF pulse is present. It is difficult to apply another RF pulse during the TI 530, and thus, a dead time is present.

Accordingly, the MRI apparatus 100 may obtain an MR image by applying an RF pulse that may excite another slice during the TI 530. For example, when an inversion RF pulse 510 for exciting an odd slice is applied, the MRI apparatus 100 may apply an RF pulse 520 that may excite an even slice during the TI 530.

The MRI apparatus 100 may read out an RF signal for generating an MR image that relates to the even slice during the TI. For example, the MRI apparatus 100 may perform echo planar imaging (EPI) readout with respect to the even slice during a TI 530. The MRI apparatus 100 may obtain a T2* weighted image by using the read RF signal. In the present exemplary embodiment, the MRI apparatus 100 may use segmented EPI.

In some exemplary embodiments, the MRI apparatus 100 may perform turbo spin echo (TSE) readout with respect to the even slice during the TI 530. The MRI apparatus 100 may obtain a T2 weighted image by using the read RF signal. Furthermore, the MRI apparatus 100 may obtain a T1 weighted image or PD image, but the exemplary embodiments are not limited thereto.

Figure 6:
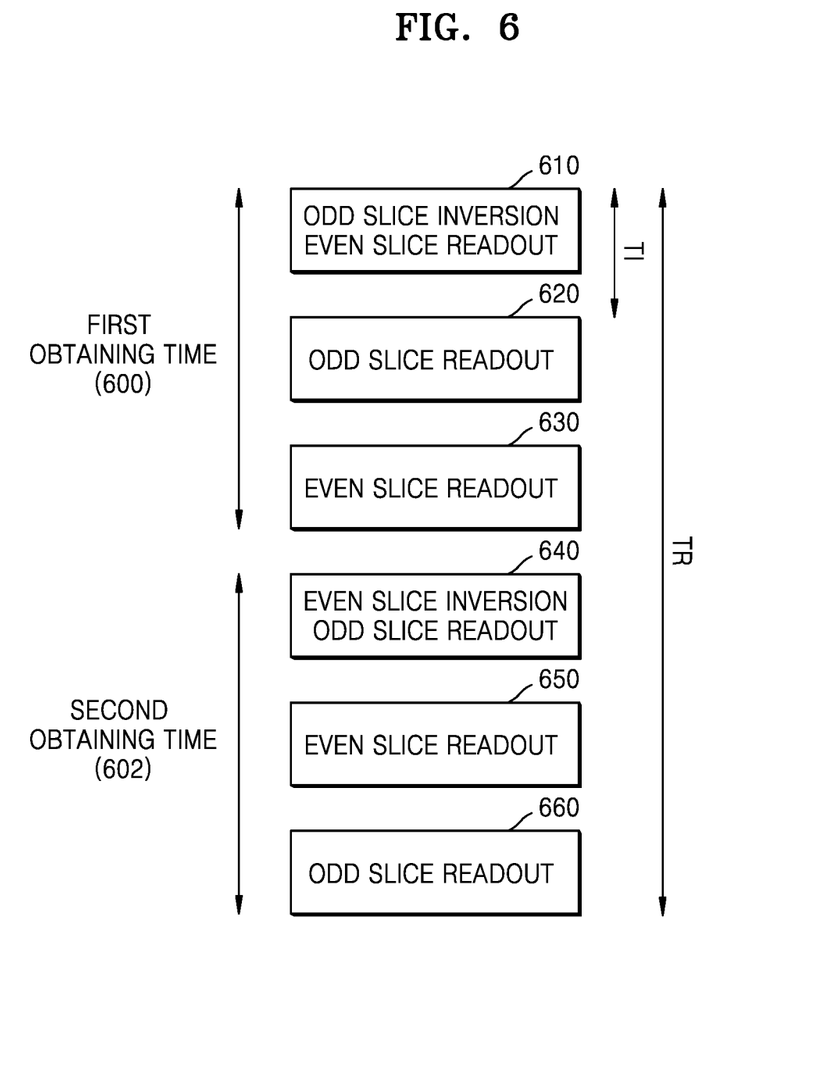
FIG. 6 is a schematic flowchart of a sequence structure, according to an exemplary embodiment.

FIG. 6 is a schematic flowchart of a structure of a sequence, according to an exemplary embodiment. In operation 610, the MRI apparatus 100 may apply an inversion RF pulse that may excite an odd slice of an object. Further, the MRI apparatus 100 may apply an RF pulse that may excite an even slice of the object during a TI. In this regard, the odd slice and the even slice respectively correspond to the 'first slice' and the 'second slice' described above with reference to FIG. 5.

The MRI apparatus 100 may read out an RF signal for generating an MR image that relates to the even slice during the TI. For example, the MRI apparatus 100 may perform EPI readout with respect to the even slice during the TI. The MRI apparatus 100 may obtain a T2* weighted image with respect to the even slice.

In operation 620, the MRI apparatus 100 may read out an RF signal for generating an MR image that relates to the odd slice of the object. For example, the MRI apparatus 100 may perform TSE readout with respect to the odd slice in order to image a FLAIR image. For example, the inversion RF pulse applied in operation 610 is a pulse that excites a part of the object that corresponds to the odd slice, and accordingly, a FLAIR image that relates to the odd slice may be obtained during the following time period by using an RF signal received in the part of the object that corresponds to the odd slice.

In operation 630, the MRI apparatus 100 may read out an RF signal for generating an MR image that relates to the even slice of the object. For example, the MRI apparatus 100 may perform TSE readout with respect to the even slice. The MRI apparatus 100 may obtain a T2 weighted image that relates to the even slice.

In the present exemplary embodiment, the operations 610, 620, and 630 may be included in a first obtaining time 600. The operations 640, 650, and 660 may be included in a second obtaining time 602. The first obtaining time 600 and the second obtaining time 602 may be included in a TR.

In operation 640, the MRI apparatus 100 may apply an inversion RF pulse that may excite an even slice of the object. Further, the MRI apparatus 100 may apply an RF pulse that may excite an odd slice of the object during a TI.

The MRI apparatus 100 may read out an RF signal for generating an MR image that relates to the odd slice during the TI. For example, the MRI apparatus 100 may perform EPI readout with respect to the odd slice during the TI. The MRI apparatus 100 may obtain a T2* weighted image that relates to the odd slice.

In operation 650, the MRI apparatus 100 may read out an RF signal for generating an MR image that relates to the even slice of the object. For example, the MRI apparatus 100 may perform TSE readout with respect to the even slice in order to image a FLAIR image. The MRI apparatus 100 may obtain a FLAIR image that relates to the even slice.

In operation 660, the MRI apparatus 100 may read out an RF signal for generating an MR image that relates to the odd slice of the object. For example, the MRI apparatus 100 may perform TSE readout with respect to the odd slice. The MRI apparatus 100 may obtain a T2 weighted image that relates to the odd slice.

In the operations 610, 620, 630, 640, 650, and 660, the MRI apparatus 100 may obtain RF signals for generating an FLAIR image, a T2* weighted image, and a T2 weighted image that relate to the object within one TR.

In the present exemplary embodiment, the MRI apparatus 100 may obtain an RF signal for generating at least one of a FLAIR image, a T2* weighted image, a T2 weighted image, a T1 weighted image, and a PD weighted image that relate to the object within one TR. However, a signal that the MRI apparatus 100 may obtain within a TR is not limited thereto.

Figure 7:
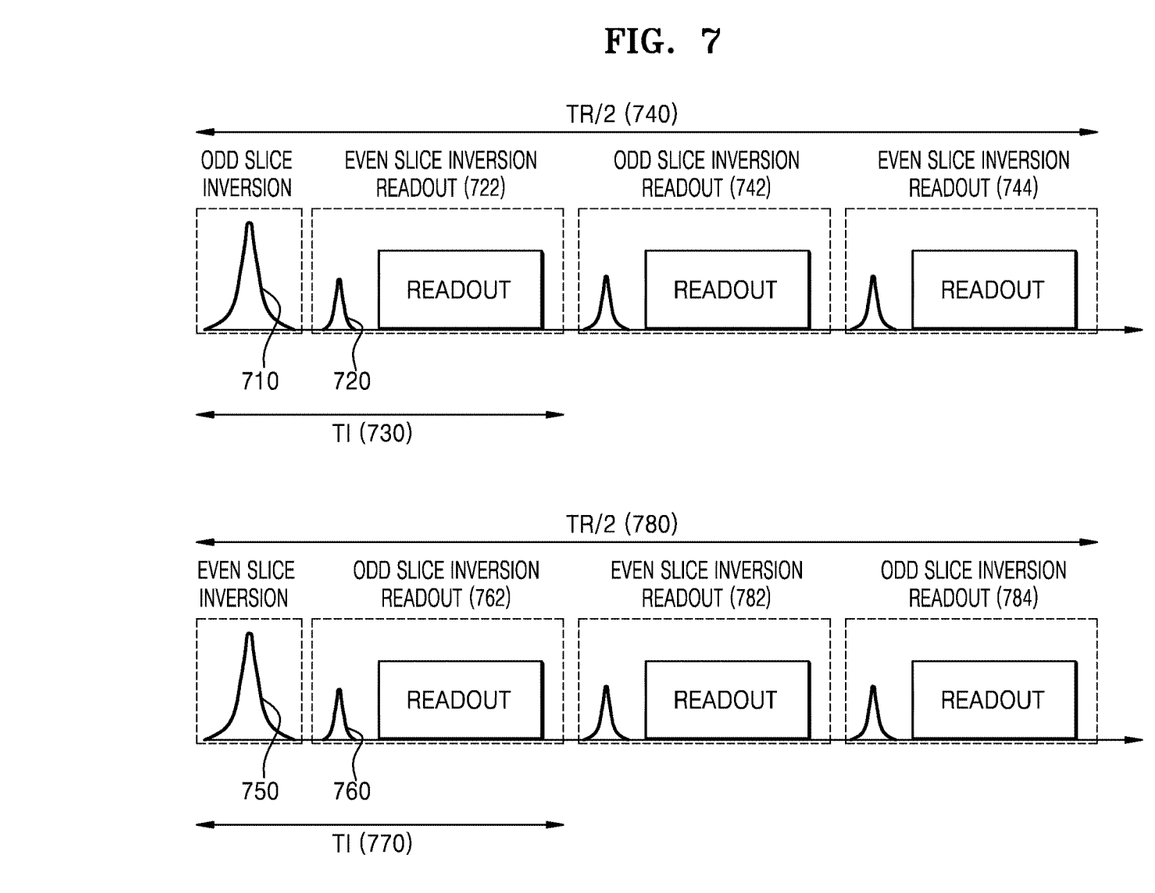
FIG. 7 illustrates a method for generating a magnetic resonance image, according to an exemplary embodiment.

FIG. 7 illustrates a method for generating a magnetic resonance image, according to an exemplary embodiment. Referring to FIG. 7, a sequence of a time period that includes a first obtaining time 740 and a second obtaining time 780 is briefly illustrated. FIG. 7 illustrates, as an example, a case where each of the first obtaining time 740 and the second obtaining time 780 has a duration that is equal to half of a TR.

Further, the operation 610 of FIG. 6 is performed during a TI 730, the operation 620 corresponds to a readout operation 742, and the operation 630 corresponds to a readout operation 744. In addition, the operation 640 of FIG. 6 is performed during a TI 770, the operation 650 corresponds to a readout operation 782, and the operation 660 corresponds to a readout operation 784. In the present exemplary embodiment, the MRI apparatus 100 may apply an inversion RF pulse 710 that may excite an odd slice of an object. Further, the MRI apparatus 100 may apply an RF pulse 720 that may excite an even slice of the object during the TI 730.

The MRI apparatus 100 may perform readout 722 of an RF signal for generating an MR image that relates to the even slice during the TI 730. For example, the MRI apparatus 100 may obtain a T2* weighted image that relates to the even slice by performing EPI readout with respect to the even slice during the TI 730.

The MRI apparatus 100 may sequentially obtain MR images that relate to the odd slice and the even slice during the remainder of the first obtaining time 740. For example, the MRI apparatus 100 may perform readout 742 of an RF signal for generating an MR image that relates to the odd slice of the object.

For example, the MRI apparatus 100 may obtain a FLAIR image by performing TSE readout with respect to the odd slice.

The MRI apparatus 100 may sequentially obtain one or more MR images that relate to the even slice during the first obtaining time 740 remaining after the obtaining of the FLAIR image. The MRI apparatus 100 may perform readout 744 of an RF signal for generating an MR image that relates to the even slice of the object.

In the present exemplary embodiment, the MRI apparatus 100 may obtain a T2 weighted image by performing TSE readout with respect to the even slice. In some exemplary embodiments, the MRI apparatus 100 may obtain at least one of a T1 weighted image, a T2 weighted image, a T2* weighted image, and a PD weighted image by performing the readout 744 of an RF signal with respect to the even slice.

During the second obtaining time 780, the MRI apparatus 100 may obtain MR images regarding slices different from those of the first obtaining time 740. In the present exemplary embodiment, the MRI apparatus 100 may apply an inversion RF pulse 750 that may excite an even slice of the object. Further, the MRI apparatus 100 may apply an RF pulse 760 that may excite an odd slice of the object during the TI 770.

The MRI apparatus 100 may perform readout 762 of an RF signal for generating an MR image that relates to the odd slice during the TI 770. For example, the MRI apparatus 100 may obtain a T2* weighted image that relates to the odd slice by performing EPI readout with respect to the odd slice during the TI 770.

The MRI apparatus 100 may sequentially obtain MR images that relate to the even slice and the odd slice during the rest of the second obtaining time 780. For example, the MRI apparatus 100 may perform readout 782 of an RF signal for generating an MR image that relates to the even slice of the object.

For example, the MRI apparatus 100 may obtain a FLAIR image by performing TSE readout with respect to the even slice.

The MRI apparatus 100 may sequentially obtain one or more MR images that relate to the odd slice during the second obtaining time 780 remaining after the obtaining of the FLAIR image. The MRI apparatus 100 may perform readout 784 of an RF signal for generating an MR image that relates to the odd slice of the object.

In the present exemplary embodiment, the MRI apparatus 100 may obtain a T2 weighted image by performing TSE readout with respect to the odd slice. In some exemplary embodiments, the MRI apparatus 100 may obtain at least one of a T1 weighted image, a T2 weighted image, a T2* weighted image, and a PD weighted image by performing the readout 784 of an RF signal with respect to the odd slice.

The above-described exemplary embodiments may be written as computer programs and may be implemented in general-use digital computers that execute the programs by using a transitory or non-transitory computer-readable recording medium.

Examples of the non-transitory computer-readable recording medium include storage media, such as a magnetic storage medium (e.g., read only memory (ROM), floppy disk, hard disk, etc.) and an optical recording medium (e.g., compact disc read only memory (CD-ROM), digital versatile disk (DVD), etc.).

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A magnetic resonance imaging (MRI) apparatus comprising:
    a radio frequency (RF) controller configured to control a period of an RF pulse to be applied to an object for a time period which includes a first obtaining time, during which a first inversion RF pulse which selectively excites a first slice is applied, and a second obtaining time; and
    a signal transceiver configured to sequentially receive, during the first obtaining time, a first RF signal based on the first inversion RF pulse for generating a first magnetic resonance (MR) image that relates to the first slice of the object and a second RF signal for generating at least one second magnetic resonance (MR) image that relates to a second slice of the object, the second slice being adjacent to the first slice,
    wherein the first MR image is a fluid attenuated inversion recovery (FLAIR) image and a type of the second MR image is different from a type of the first MR image.

2. The MRI apparatus of claim 1, further comprising an image processor configured to obtain the first MR image based on the first RF signal and to obtain the at least one second MR image based on the second RF signal.

3. The MRI apparatus of claim 1, wherein, after an inversion time (TI) ends, the first RF signal is received earlier than the second RF signal.

4. The MRI apparatus of claim 1, wherein the first obtaining time is included in a first half of a repetition time (TR), and
    the second obtaining time is included in a second half of the TR.

5. The MRI apparatus of claim 2, wherein the image processor is further configured to obtain, based on the second RF signal, at least one image from among a T1 weighted image, a T2 weighted image, a T2* weighted image, and a proton density (PD) image.

6. The MRI apparatus of claim 5, wherein the image processor is further configured to sequentially obtain the at least one image.

7. The MRI apparatus of claim 1, wherein the RF controller is further configured to apply a second inversion RF pulse during the second obtaining time, and
    the signal transceiver is further configured to sequentially receive, during the second obtaining time, a third RF signal for generating a third MR image that relates to the second slice and a fourth RF signal for generating at least one fourth MR image that relates to the first slice, wherein the third MR image is a FLAIR image.

8. The MRI apparatus of claim 7, further comprising an image processor configured to obtain the third MR image based on the third RF signal and to obtain the at least one fourth MR image that relates to the first slice based on the fourth RF signal.

9. A method for obtaining a magnetic resonance (MR) image, the method comprising:
    applying a first inversion radio frequency (RF) pulse which selectively excites a first slice to an object during a first obtaining time;
    applying an RF pulse to the object for a time period that includes the first obtaining time and a second obtaining time; and
    sequentially receiving a first RF signal based on the first inversion RF pulse for generating a first magnetic resonance (MR) image that relates to the first slice of the object and a second RF signal for generating at least one second MR image that relates to a second slice of the object, the second slice being adjacent to the first slice,
    wherein the first MR image is a fluid attenuated inversion recovery (FLAIR) image and a type of the second MR image is different from a type of the first MR image.

10. The method of claim 9, further comprising obtaining the first MR image based on the first RF signal and obtaining the at least one second MR image based on the second RF signal.

11. The method of claim 9, wherein, after an inversion time (TI) ends, the first RF signal is received earlier than the second RF signal.

12. The method of claim 9, wherein the first obtaining time is included in a first half of a repetition time (TR), and the second obtaining time is included in a second half of the TR.

13. The method of claim 10, wherein the obtaining the at least one MR image comprises obtaining at least one image from among a T1 weighted image, a T2 weighted image, a T2* weighted image, and a proton density (PD) image.

14. The method of claim 13, wherein the obtaining the at least one image comprises sequentially obtaining the at least one image.

15. The method of claim 9, further comprising applying a second inversion RF pulse during the second obtaining time, and sequentially receiving, during the second obtaining time, a third RF signal for generating a third MR image that relates to the second slice and a fourth RF signal for generating at least one fourth MR image that relates to the first slice, wherein the third MR image is a FLAIR image.

16. The method of claim 15, further comprising obtaining the third MR image based on the third RF signal and obtaining the at least one fourth MR image that relates to the first slice based on the fourth RF signal.

17. A non-transitory computer-readable recording medium having recorded thereon a program for implementing the method of claim 9.

* * * * *